United States Patent
Chen et al.

(10) Patent No.: US 10,199,153 B2
(45) Date of Patent: Feb. 5, 2019

(54) PCB INTER-LAYER CONDUCTIVE STRUCTURE APPLICABLE TO LARGE-CURRENT PCB

(71) Applicant: CYNTEC CO., LTD., Hsinchu (TW)

(72) Inventors: Yi-Wei Chen, Hsinchu (TW); Cheng-Chang Lee, Hsinchu (TW)

(73) Assignee: CYNTEC CO., LTD, Hsinchu (TW)

( * ) Notice: Subject to any disclaimer, the term of this patent is extended or adjusted under 35 U.S.C. 154(b) by 239 days.

(21) Appl. No.: 14/755,528

(22) Filed: Jun. 30, 2015

(65) Prior Publication Data

US 2016/0055958 A1 Feb. 25, 2016

(30) Foreign Application Priority Data

Aug. 19, 2014 (TW) .............................. 103128505 A

(51) Int. Cl.
*H05K 3/40* (2006.01)
*H01F 27/28* (2006.01)
(Continued)

(52) U.S. Cl.
CPC ..... *H01F 27/2804* (2013.01); *H01F 17/0033* (2013.01); *H05K 1/0298* (2013.01);
(Continued)

(58) Field of Classification Search
CPC .... H05K 1/115; H05K 3/4038; H05K 3/4007; H05K 3/46–3/4697; H05K 1/0298;
(Continued)

(56) References Cited

U.S. PATENT DOCUMENTS

| 4,649,461 A * | 3/1987 | Matsuta | H05K 3/4641 |
| | | | 174/51 |
| 5,337,466 A * | 8/1994 | Ishida | H01L 21/4857 |
| | | | 156/89.12 |

(Continued)

FOREIGN PATENT DOCUMENTS

| CN | 202662441 | 1/2013 |
| TW | M362499 | 8/2009 |
| TW | 201346947 | 11/2013 |

OTHER PUBLICATIONS

PCB Dictionary, terms posted on CHINA PCB Forum (www.pcbbbs.com) and available online at http://read.pudn.com/downloads92/ebook/360082/PCB%D7%A8%D2%B5%CA%F5%D3%EF%B4%CA%B5%E4.pdf, Jun. 7, 2000.

*Primary Examiner* — Peter DungBa Vo
*Assistant Examiner* — Kaying Kue
(74) *Attorney, Agent, or Firm* — Kirton McConkie; Evan R. Witt

(57) ABSTRACT

For producing an inter-layer conductive structure of a circuit board, an insulating layer, a first conductive layer, a second conductive layer and an electric contact material are provided, wherein the insulating layer includes at least a conductive hole therein. The electric contact material is inserted into the conductive hole of the insulating layer to form a conductive plug, and the first and second conductive layers are laminated to opposite surfaces of the insulating layer, respectively. After lamination, the conductive plug has two ends thereof in electric contact with the first conductive layer and the second conductive layer, respectively.

14 Claims, 14 Drawing Sheets

(51) Int. Cl.
*H05K 1/02* (2006.01)
*H05K 1/11* (2006.01)
*H05K 3/06* (2006.01)
*H01F 17/00* (2006.01)
*H05K 3/46* (2006.01)

(52) U.S. Cl.
CPC ............... *H05K 1/115* (2013.01); *H05K 3/06* (2013.01); *H05K 3/4069* (2013.01); *H01F 2017/0093* (2013.01); *H01F 2027/2819* (2013.01); *H05K 1/0263* (2013.01); *H05K 3/4614* (2013.01); *H05K 3/4652* (2013.01); *H05K 2201/09563* (2013.01)

(58) Field of Classification Search
CPC ...... H05K 1/0263; H05K 3/06; H05K 3/4069; H05K 3/4652; H05K 3/4614; H05K 2201/09563; H01F 27/2804; H01F 2017/0093; H01F 2027/2819
USPC ................................... 29/852, 846, 829, 825
See application file for complete search history.

(56) References Cited

U.S. PATENT DOCUMENTS

| | | | | |
|---|---|---|---|---|
| 5,478,972 | A * | 12/1995 | Mizutani | H05K 3/4038 174/250 |
| 5,888,627 | A * | 3/1999 | Nakatani | B32B 27/12 174/264 |
| 6,270,607 | B1 * | 8/2001 | Tachibana | H05K 3/4602 156/150 |
| 6,831,544 | B2 | 12/2004 | Patel et al. | |
| 7,199,569 | B1 | 4/2007 | Nakahori | |
| 2002/0129894 | A1 * | 9/2002 | Liu | B32B 7/12 156/291 |
| 2004/0046006 | A1 * | 3/2004 | Olofsson | H05K 1/0204 228/180.1 |
| 2005/0224256 | A1 * | 10/2005 | Osawa | H05K 3/4614 174/260 |
| 2006/0073701 | A1 * | 4/2006 | Koizumi | H01L 21/6835 438/666 |
| 2007/0169960 | A1 * | 7/2007 | Hayashi | H05K 3/4046 174/262 |
| 2009/0095520 | A1 * | 4/2009 | Fukase | H05K 3/445 174/266 |
| 2009/0175022 | A1 * | 7/2009 | Kwon | H01L 21/486 361/820 |
| 2015/0155091 | A1 | 6/2015 | Chang et al. | |

* cited by examiner

PCB INTER-LAYER CONDUCTIVE STRUCTURE APPLICABLE TO LARGE-CURRENT PCB

FIELD OF THE INVENTION

The present invention relates to an inter-layer conductive structure and a producing process thereof, and more particularly to an inter-layer conductive structure formed in a multi-layer printed circuit board (PCB), which is applicable to a planar type of coil winding unit, and a producing process thereof. The present invention also relates to an electromagnetic component, in which the inter-layer conductive structure is adopted.

BACKGROUND OF THE INVENTION

A conventional multi-layer PCB includes conductive material in holes of an insulating layer for electric conduction between two conductive layers respectively overlying and underlying the insulating layer. Depending on the disposition ways in the board, three types of holes, including through holes, blind via holes and buried via holes, are commonly known in the art.

Conventionally, holes are created by drilling the insulating layer with a machine or laser, and copper is deposited on inner walls of the holes by way of electroplating, thereby forming the conductive holes. As known, an electroplating process involves long processing time, high cost, serious contamination and high energy consumption. Aside from, since it is hard to fill the entire space inside the holes with copper by way of electroplating, there are likely voids existing in the holes, particularly in the center and top/bottom of the space, so as to underlying affect the effective area of the overlying and underlying copper lines (pattern) at these sites. Furthermore, if the resulting device involves a relatively large intensity of load current, a relatively large size of each single hole would be required in consideration of minimizing resistance. However, more and larger voids might be formed in a larger hole. Conventionally, resins are additionally used for filling voids. The conductive holes thus occupy a significant area of the circuit board. Resin filling would hinder miniaturization of the circuit board, lower reliability, and increase procedures, time and cost. Moreover, the intensity and density distribution of the load current still vary with the copper electroplating thickness on the inner wall of a single hole and the cross-sectional area of the single hole. To prevent the electroplated copper on the inner wall of a single hole from stripping, extensive electroplating would be needed to form a copper ring of 0.5 mm wide or more surrounding the top/bottom openings of the hole.

Another prior art is related to a multi-holes structure, which is advantageous in reduced resistivity, but on the other hand, might cause problems in layout. For example, long electric traces might be required in the layout in order to bypass the conductive holes. Furthermore, in considerations of structure strength and insulating property, sufficient spacing is required between conductive holes and between conductive holes and copper wires. As a result, the overall area of the circuit board would need to increase, and thus the cost would be undesirably raised and the compactness of the product would be adversely affected.

SUMMARY OF THE INVENTION

Therefore, the present invention provides an inter-layer conductive structure of a circuit board, which is adapted to large-current applications, and a process for producing the inter-layer conductive structure.

In accordance with an aspect of the present invention, a process for producing an inter-layer conductive structure of a circuit board, comprises steps of:
a) providing a first insulating layer, a first conductive layer, a second conductive layer and a first electric contact material, wherein the first insulating layer includes at least a first conductive hole therein;
b) inserting the first electric contact material into the first conductive hole of the first insulating layer to form a first conductive plug;
c) laminating the first conductive layer onto a first surface of the first insulating layer; and
d) laminating the second conductive layer onto a second surface of the first insulating layer;
wherein after the laminating steps c) and d) are completed, the first conductive plug has two ends thereof in electric contact with the first conductive layer and the second conductive layer, respectively.

In an embodiment, the step b) is performed before the laminating steps c) and d). In an alternative embodiment, the step b) is performed together with one of the laminating steps c) and d), and the other of the laminating steps c) and d) is performed subsequently. In another alternative embodiment, one of the laminating steps c) and d) is performed before the step b), and the other of the laminating steps c) and d) is performed together with the step b). In a further alternative embodiment, one of the laminating steps c) and d) is performed before the step b), and the other of the laminating steps c) and d) is performed after the step b).

For example, the insulating layer can be formed of a prepreg; the conductive layer can be formed of metal copper; and the electric contact material can be tin alloy.

In an embodiment, the laminating procedures can be performed by way of heat press with a temperature ranged between 100 and 250° C.

In an embodiment, the process further includes steps of:
e) performing a first pattern-defining and etching procedure for the first conductive layer to form a first conductive structure after the laminating step c); and
f) performing a second pattern-defining and etching procedure for the second conductive layer to form a second conductive structure after the laminating step d);
wherein the steps e) and f) are performed simultaneously or separately.

In an embodiment, after the pattern-defining and etching procedures the first conductive e) and f), the first conductive structure and the second conductive structure cover the entire area of the two ends of the first conductive plug, respectively. Alternatively, after the pattern-defining and etching procedures e) and f), at least one of the first conductive structure and the second conductive structure partially covers the corresponding one of the two ends of the first conductive plug in contact therewith.

In accordance with another aspect of the present invention, an inter-layer structure of a circuit board comprises:
a first insulating layer having a first surface, a second surface opposite to the first surface, and a first conductive hole penetrating through the first insulating layer so as to form a first opening on the first surface and a second opening on the second surface;
a first conductive structure disposed on the first surface of the first insulating layer, and selectively covering a part of or the entire area of the first opening;

a second conductive structure disposed on the second surface of the first insulating layer, and selectively covering a part of or the entire area of the second opening; and a first conductive plug formed of an electric contact material and disposed in the first conductive hole with two ends thereof in contact with the first conductive structure and the second conductive structure for electric conduction.

In an embodiment, a melting point of the conductive plug is lower than that of at least one of the first and second conductive structures.

In accordance with a further aspect of the present invention, a planar type of coil winding unit comprises the inter-layer conductive structure as described above and further comprises:

a second insulating layer overlying the first conductive structure and having a second conductive hole penetrating through the second insulating layer;

a second conductive plug formed of an electric contact material and disposed in the second conductive hole; and a third conductive structure disposed on the second insulating layer, and electrically connected to the first conductive structure through the second conductive plug;

wherein each of the first conductive structure, the second conductive structure and the third conductive structure is a C-shaped ring having an opening.

In an embodiment, openings of the C-shaped rings used as the first conductive structure, the second conductive structure and the third conductive structure are staggered from one another, and electrically connected to one another through the first conductive plug and the second conductive plug.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
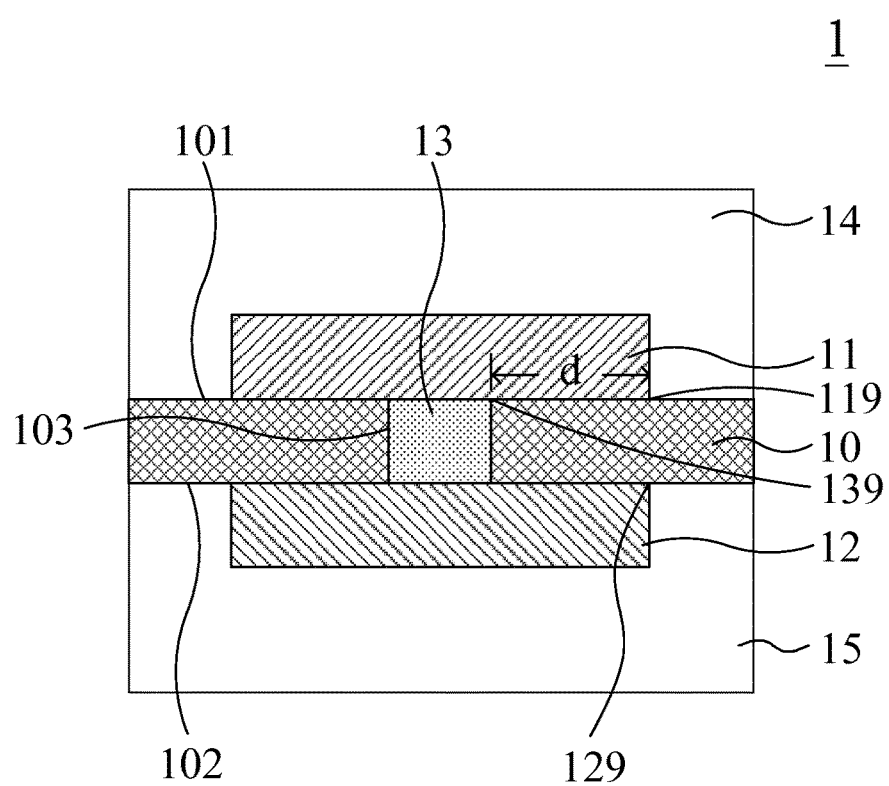
FIG. 1 is a cross-sectional view schematically illustrating a PCB inter-layer conductive structure according to an embodiment of the present invention.

Referring to FIG. 1, a cross-sectional view of a PCB inter-layer conductive structure according to an embodiment of the present invention is schematically shown. The PCB inter-layer conductive structure 1 includes an insulating layer 10, first and second conductive structures 11 and 12 having specific patterns, and an electric contact material 13. The insulating layer 10 has a first surface 101 and a second surface 102 opposite to each other and at least one conductive hole 103 disposed between the surfaces 101 and 102. The first conductive structure 11 is disposed on the first surface 101 of the insulating layer 10 and overlies openings of one, some or all of the conductive holes 103 on the first surface 101. The second conductive structure 12 is disposed on the second surface 102 of the insulating layer 10 and overlies openings of one, some or all of the conductive holes 103 on the second surface 102. The electric contact material 13 is disposed inside each the conductive hole 103, and preferably is confined inside the conductive hole 103. Hereinafter, only one conductive hole 103 is shown and illustrated for detailed descriptions. Furthermore, the conductive structures 11 and 12 may overly a part of the opening or the entire opening depending on practical designs provided that the electric conduction can be assured.

The electric contact material 13 is in electric contact with both the first conductive structure 11 and the second conductive structure 12 with two ends thereof. Tin alloy is one of the examples of the electric contact material 13. The tin alloy is filled into the conductive hole as tightly as possible to avoid undesirable voids in the conductive hole as well as near the openings of the conductive hole on the first and second surfaces 101 and 102. The resulting PCB inter-layer conductive structure 1 has the first and second conductive structures 11 and 12, e.g. two copper plates, overlie and contact with opposite ends of the tin alloy column filling the conductive hole. Accordingly, the current intensity of the conductive hole can be effectively increased. Furthermore, by overlying the conductive structures on the openings of the conductive hole to closely contact with the tin alloy column, as shown in FIG. 1, it is possible to form the tin alloy column without any extensive flange around openings of the conductive hole, or the width of the flange, if any, may be down-size to a level less than 0.5 mm. In other words, assuming the diameter of the opening of the conductive hole is 5 mm, the width of the wire formed with the conductive structure needs only to be equal or just a little larger than 5 mm. In some cases, the width of the wire may even less than 5 mm if the electric conduction can be accomplished with the wire partially overlying the opening.

The electric contact material 13 may differ from the material of the first conductive structure 11 or the second conductive structure 12. One of the points is that the melting point of the electric contact material 13 should be no higher and preferably lower than the melting points of the material of the first conductive structure 11 and the second conductive structure 12. For example, when the electric contact material 13 is tin alloy, it is proper that the material of the first conductive structure 11 and the second conductive structure 12 is copper having a higher melting point than tin alloy. As such, the electric contact material 13 would melt during reflow soldering so as to have better contact with the first conductive structure 11 and the second conductive structure 12. In addition, the contact surfaces between the electric contact material 13 and the conductive structures 11 and 12 would become smooth, and the resistivity can be further lowered. Other examples of the electric contact material 13 include gallium (Ga), bismuth (Bi), indium (In), lead (Pb), cadmium (Cd), silver (Ag), zinc (Zn), gold (Au), aluminum (Al) alloy, and so on. Compared with the prior art, the tin alloy column according to the present invention is softened during reflow soldering so as to facilitate close contact with the copper plates of the first and second conductive structures 11 and 12. Meanwhile, the first and second conductive structures 11 and 12 remain solid and have substantially fixed shapes during reflow soldering. Therefore, the tin alloy column can be effectively confined within the conductive hole, and has little or no overflow from the openings of the conductive hole. Accordingly, it is not necessary to have wide conductive structures, and the width difference d between the circumferential edge 139 of the conductive hole 13 and the circumferential edge 119 of the first conductive structure 11 or the circumferential edge 129 of the second conductive structure 12 can be minimized. As a result, with similar current density, the area the PCB inter-layer conductive structure, including circumferential extensions of the conductive hole and conductive structures, occupies is less in the present invention than in the prior art.

As shown in FIG. 1, the PCB inter-layer conductive structure 1 further includes protection layers 14 and 15. The protection layer 14 is disposed on the first surface 101 of the insulating layer 10 and overlies the first conductive structure 11. The protection layer 15 is disposed on the second surface 102 of the insulating layer 10 and overlies the second conductive structure 12.

Hereinafter, the producing process of the above-described PCB inter-layer conductive structure 1 will be described in more detail.

Figure 2A:
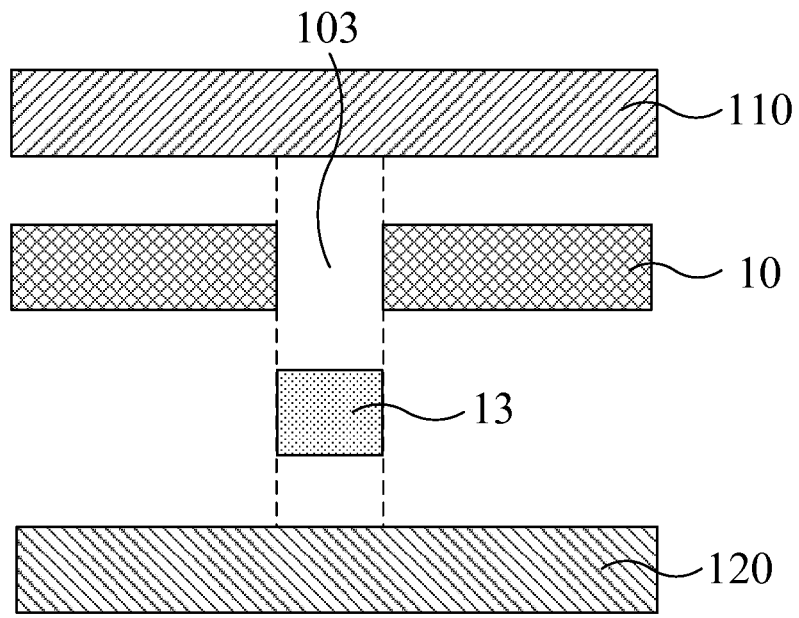
FIGS. 2A~2D are cross-sectional views schematically illustrating a producing process of the PCB inter-layer conductive structure as shown in FIG. 1.

Please refer to FIG. 2A through FIG. 2D to realize the flow of the producing process. First of all, as shown in FIG. 2A, an insulating layer 10, a first conductive layer 110, a second conductive layer 120 and an electric contact material 13 in a solid state are provided, wherein one or more conductive holes 103 have been created in the insulating layer 10 in spite only one is shown in the figures for simplification. The electric contact material 13 is different from the material of the first conductive layer 110 and the second conductive layer 120, and the melting point of the electric contact material 13 is lower than each of the melting point of the material of the first conductive layer 110 and the second conductive layer 120. The area of each of the first conductive layer 110 and the second conductive layer 120 is substantially equal to the area of the insulating layer 10 in contact therewith.

Figure 2B:
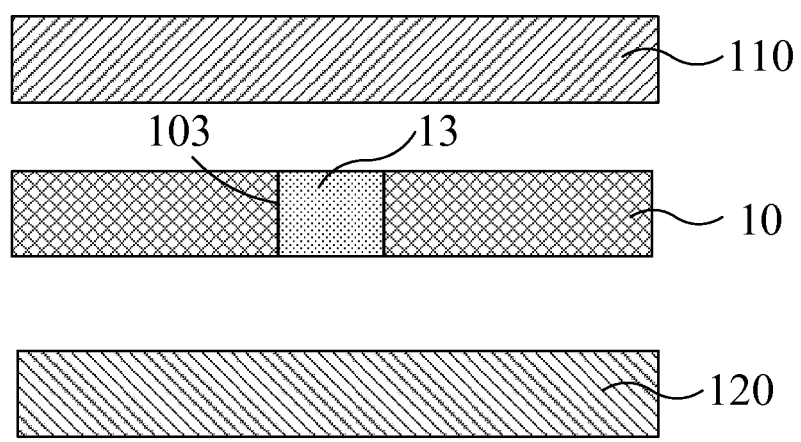
Figure 2C:
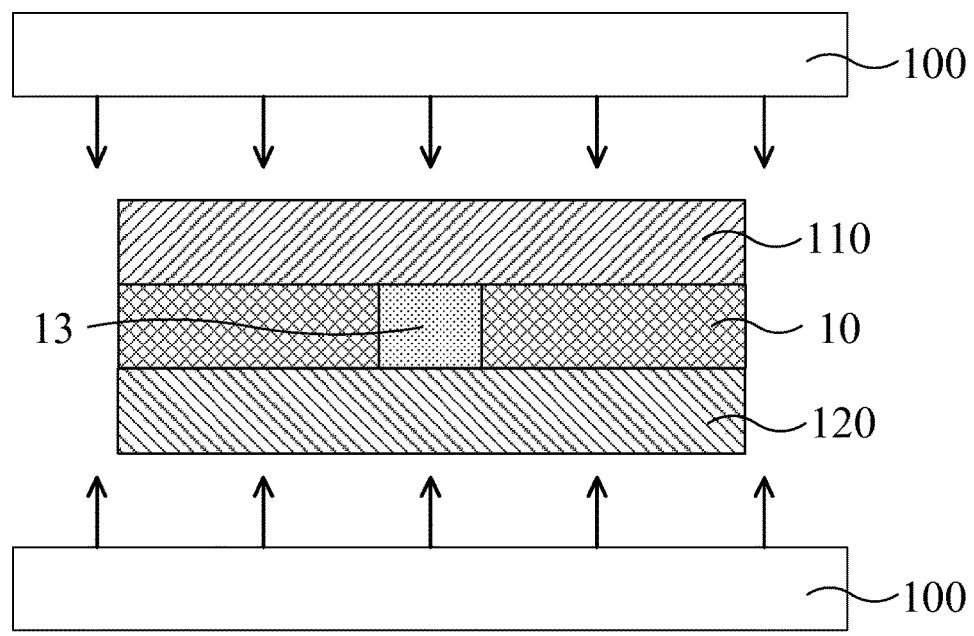

The insulating layer 10 is aligned with and disposed between the first conductive layer 110 and the second conductive layer 120, which have not yet patterned, and the electric contact material 13 is aligned with the conductive hole 13 of the insulating layer 10. The electric contact material 13 can be inserted into the conductive hole 13 first with a proper installation tool, as shown in FIG. 2B, thereby forming a conductive plug in the insulating layer 10. Alternatively, the electric contact material 13 can be placed right above or below the opening of the conductive hole 103 and then pushed into the conductive hole 13 while the first conductive layer 110 and/or the second conductive layer 120 are being pressed and laminated to the insulating layer 10, for example with a tool 100 as shown in FIG. 2C. The conductive layers can be laminated to the insulating layer 10 at one time or separately. In a further example, if the electric contact material 13 is in a liquid or paste state, one of the conductive layers, e.g. the second conductive layer 120, is laminated to the insulating layer 10 first to seal one opening of the conductive hole 103. Then the liquid electric contact material 13 is filled into the conductive hole 103 from the free opening, and optionally solidified. Afterwards, the other conductive layer, e.g. the first conductive layer 110, is laminated to the resulting structure. Solid electric contact material 13 may also be used in this two-step lamination. According to the present invention, by filling the conductive hole with the electric contact material 13 before or during the lamination process, and then performing the pattern-defining and etching process, the problems encountered in the prior art can be effectively solved.

In the lamination process illustrated in FIG. 2C, the first conductive layer 110 and the second conductive layer 120 are respectively coupled onto the upper and lower surfaces of the insulating layer 10 with the electric contact material 13 inserted therein. The first conductive layer 110 overlies the opening of the conductive hole 103 on the first surface 101 of the insulating layer 10, and the second conductive layer 120 overlies the opening of the conductive hole 103 on the second surface 102 of the insulating layer 10. The lamination process can be conducted with heat. The electric contact material 13 subjected to the reflow soldering would be melt or softened by heat so as to readily fill the conductive hole 103 densely, thereby forming a substantially solid inter-layer conductive plug. After the first and second conductive layers are laminated onto opposite surfaces of the insulating layer 10, the opposite ends of the inter-layer conductive plug exposed from the openings will be in electric contact with the lower surface of the first conductive layer and the upper surface of the second conductive layer.

Figure 2D:
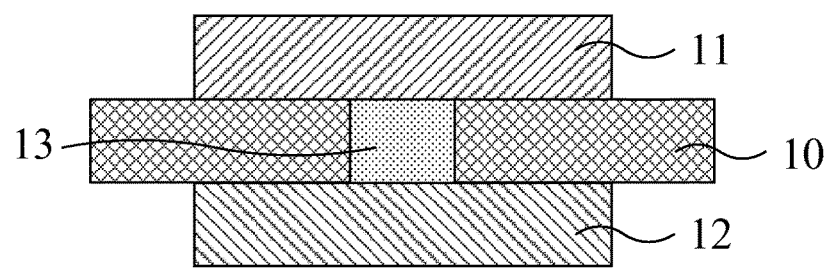

Subsequently, a pattern-defining and etching process is performed to form the first and second conductive structures 11 and 12 from the first and second conductive layers 110 and 120, respectively, as shown in FIG. 2D. The pattern-defining and etching process includes a lithographic process in which etching masks are used but omitted from the drawings. Afterwards, protection layers 14 and 15 are formed to cover the structure of FIG. 2D so as to form the inter-layer conductive structure as shown in FIG. 1.

In the above embodiment, the material of the insulating layer 10 is, for example, a prepreg (abbrv. "PP"). As known to those skilled in the art, a prepreg is a kind of glass fiber fabric material pre-impregnated with epoxy resin. Commercially available NP-140TL Prepreg produced by NAN YA PLASTICS CORPORATION (Taiwan) is one of the examples applicable to the present invention. In considerations of conductivity, the material of the first conductive layer 110 for producing the first conductive structure 11 and the material of the second conductive layer 120 for producing the second conductive structure 12 can be, for example, copper foil, i.e. metal copper, or metal silver, although other metal material may also be used to practice the present invention. The resulting conductive structures are used for electric conduction and signal transmission, and the configurations of the conductive structures are particularly designed to form desired transmission paths and exhibit required electric and magnetic properties. Of course, they might be patterned for any other purpose while being a part of the inter-layer conductive structure according to the present invention.

In this embodiment, the electric contact material 13 is tin alloy, which is only an example and may be replaced with any other suitable metal or metallic material. As known, tin alloy is advantageous in having relatively low melting point and high plasticity so as to be melted or softened during reflow soldering. Nevertheless, other material with a melting point higher than that of tin alloy may also be used as the electric contact material 13 under the requirement of the melting point lower than the reflow soldering temperature, e.g. 150~260° C. For lowering the resistance between each of the upper/lower copper wires and the tin alloy body, i.e. the resistance of the conductive hole, the opposite ends of the tin alloy body may be optionally soldered with the copper surfaces of the first and second conductive structures 11 and 12 facing the tin alloy body in the reflow soldering process.

The conductive hole or holes 103 of the insulating layer 10 shown in FIGS. 1 and 2A~2D may be created by, for example, laser drilling or punching press. The electric contact material 13 may be formed into a body with size and shape consistent to the conductive hole, e.g. a column as shown in FIG. 2A, by punching press. Furthermore, the lamination process included in the present method may be, but is not limited to, a high-temperature heat-pressing process. In the example that prepreg, copper foil and tin alloy are respectively used as the insulating layer 10, conductive layers 11, 12 and electric contact material 13, the heat-pressing temperature preferably lies between 100 and 250° C. Furthermore, the pattern-defining and etching process may include a photolithographic process or any other suitable process for defining patterns. In the prior art, when a conductive hole having a diameter greater than 0.1 mm is subjected to copper electroplating with one ounce copper, some circuit board area around the openings of the conductive hole would be adversely occupied, and there might be voids existing in the conductive hole. In contrast, according to the present invention, on the same condition that the diameter of the conductive hole is greater than 0.1 mm, since the first conductive structure 11 and the second conductive structure 12 cover the openings of the conductive hole 103 respectively at the first and second surfaces 101 and 102, the electric contact material 13 would hardly overflow and occupy surficial area of the circuit board. In addition, compared with the prior art, the electric contact material 13 has a larger contact area, e.g. up to the entire cross-sectional area of the conductive hole, with the conductive structures 11 and 12. In particular when the diameter of the conductive 103 of the insulating layer 10 is greater than or equal to, for example 0.2 mm, the effect of enlarging current or lowering resistance through the conductive hole can be further improved with similar heat generation.

Figure 5A:
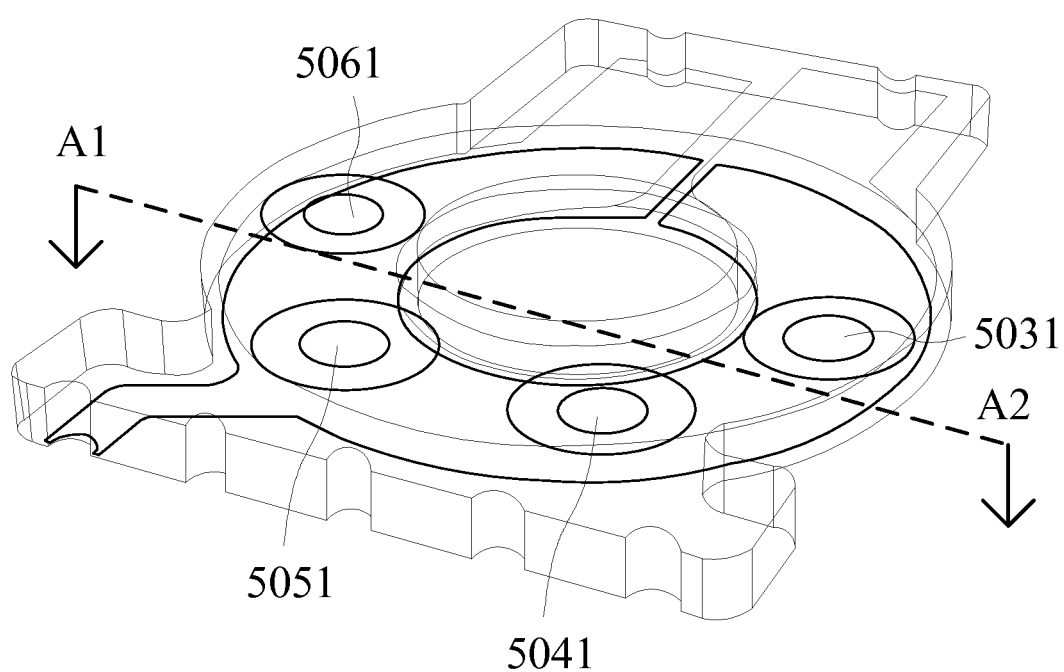
FIG. 5A is a perspective diagram schematically illustrating an exemplified coil winding unit of a planar type of PCB where a PCB inter-layer conductive structure according to the present invention can be used.

For example, the process according to the above embodiment of the present invention can be used to form one of the inter-layer conductive structures of a planar PCB coil winding unit, as shown in FIG. 5A. In this example, the first conductive structure 11 and the second conductive structure 12 as shown in FIGS. 1 and 2A~2D are configured as C-shaped rings after the pattern-defining and etching step, and serve as conductive structures of the coil winding unit. The C-shaped ring is only an example, and the shapes of the conductive structures 11 and 12 may vary with practical requirement of the circuitry. Furthermore, it is possible to produce a plurality of coil winding units at the same time by etching the first conductive layer 110 and the second conductive layer 120 into a plurality of sets of C-shaped conductive structures 11 and 12 covering openings of corresponding conductive holes 13, and properly dividing the resulting structure into coil winding units, each including one set of C-shaped conductive structures 11 and 12.

Although the pattern-defining and etching process for forming the first and second conductive structures in the above embodiment is performed after lamination of the first conductive layer 11, the insulating layer 10 with the electric contact material 13 filled therein, and the second conductive layer 12 is completed, this order is not essential and can be changed. As described above, the lamination of the layers may be conducted in variety of ways. For example, one of the first conductive layer 110 and the second conductive layer 120 is previously bonded with the electric contact material 13 by way of heat-pressing or adhesive with the facilitation of a tool. Then the other of the first and second conductive layers 11 and 12 is attached onto the insulating layer 10 while pushing the electric contact material 13 into the corresponding conductive hole 13. This example is advantageous in easy and precise alignment of the electric contact material 13 with the corresponding conductive hole 103.

Figure 3:
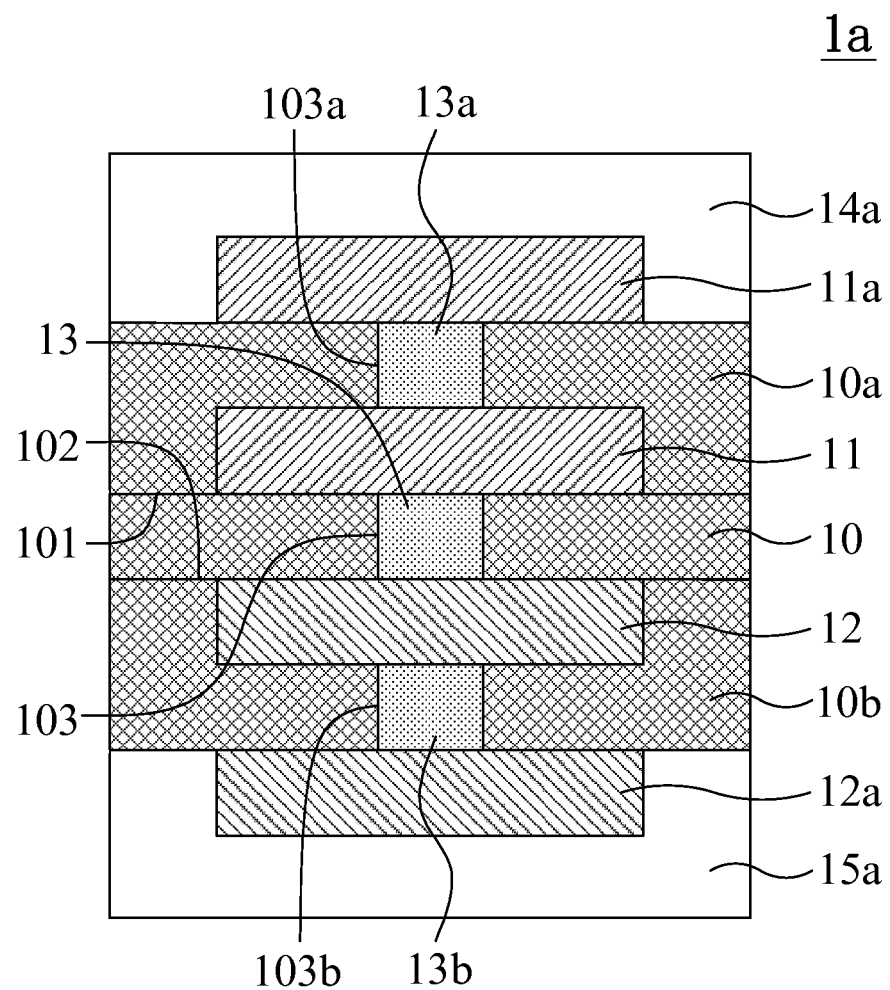
FIG. 3 is a cross-sectional view schematically illustrating a PCB inter-layer conductive structure according to another embodiment of the present invention.

Please refer to FIG. 3, which is a cross-sectional view schematically illustrating a PCB inter-layer conductive structure according to another embodiment of the present invention. The PCB inter-layer conductive structure 1a as shown in FIG. 3 is similar to the PCB inter-layer conductive structure 1 as shown in FIG. 1 except that the PCB inter-layer conductive structure 1a is a multi-layer structure and additionally includes two insulating layers 10a and 10b, third and fourth conductive structures 11a and 11b with specific patterns, and electric conductive materials 13a and 13b. The insulating layer 10a is disposed on the first surface 101 of the insulating layer 10 and overlies the first conductive structure 11, and has one or more conductive holes 103a therein. The insulating layer 10b is disposed on the second surface 102 of the insulating layer 10 and overlies the second conductive structure 12, and has one or more conductive holes 103b therein. The third conductive structure 11a is disposed on the upper surface of the insulating layer 10a and selectively covers openings of one, some or all of the conductive holes 103a. The insulating layer 10a is disposed between the first conductive structure 11 and the third conductive structure 11a. The fourth conductive structure 11b is disposed on the lower surface of the insulating layer 10b and selectively covers openings of one, some or all of the conductive holes 103b. The insulating layer 10b is disposed between the second conductive structure 12 and the fourth conductive structure 12a. The electric contact material 13a is disposed inside the conductive hole 103a of the insulating layer 10a to be in electric contact with the first conductive structure 11 and the second conductive structure 12 with two ends thereof. The electric contact material 13b is disposed inside each the conductive hole 103b of the insulating layer 10b to be in electric contact with the second conductive structure 12 and the fourth conductive structure 12a with two ends thereof. Hereinafter, only one conductive hole 103a/103b is shown in each layer and illustrated for detailed descriptions. Furthermore, the conductive structures 11, 11a, 12 and 12a may overly a part of the opening or the entire opening of one conductive hole depending on practical designs provided that the electric conduction can be assured.

Furthermore, the PCB inter-layer structure as shown in FIG. 3 includes an upper protection layer 14a and a lower protection layer 15a. The protection layer 14a is disposed on the upper surface of the insulating layer 10a and covers the third conductive structure 11a, and the protection layer 15a is disposed on the lower surface of the insulating layer 10b and covers the fourth conductive structure 12a. The material of the protection layers can be, for example, but not limited to, a solder resist ink. In this embodiment, the conductive holes 103, 103a and 103b of the insulating layers 10, 10a and 10b are distributed based on circuitry requirement.

Although the conductive holes 103, 103a and 103b are shown to be aligned with one another, it is not essential and can be varied according to practical requirements.

Hereinafter, the producing process of the inter-layer conductive structure 1a of the multi-layer PCB as shown in FIG. 3 will be illustrated with reference to FIG. 4A~4H. First, referring to FIG. 4A, an insulating layer 10, a first conductive layer 110, a second conductive layer 120 and an electric contact material 13 in a solid state are provided, wherein one or more conductive holes 103 have been created in the insulating layer 10 in spite only one is shown in the figures for simplification. The electric contact material 13 is different from the material of the first conductive layer 110 and/or the second conductive layer 120, and the melting point of the electric contact material 13 is lower than each of the melting points of the material of the first conductive layer 110 and the second conductive layer 120. The area of each of the first conductive layer 110 and the second conductive layer 120 is substantially equal to the area of the insulating layer 10 in contact therewith.

Figure 4A:
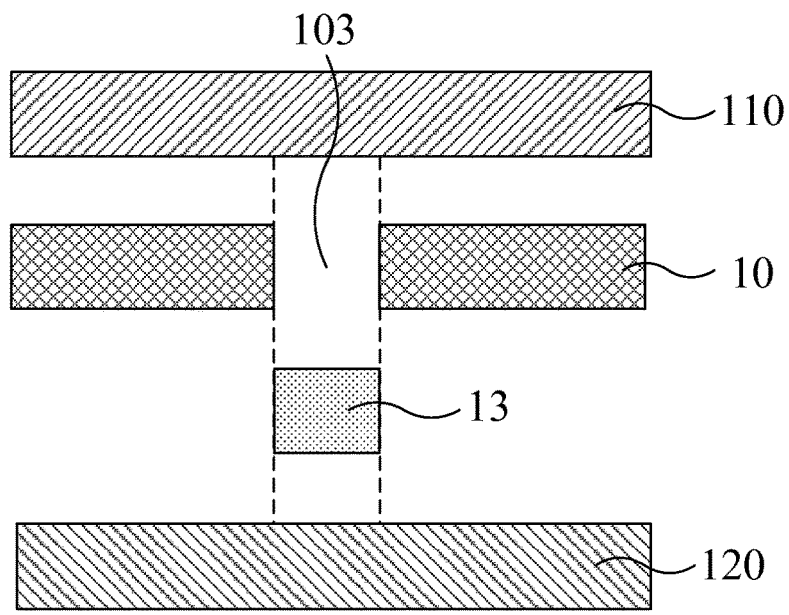
FIGS. 4A~4H are cross-sectional views schematically illustrating a producing process of the PCB inter-layer conductive structure as shown in FIG. 3.
Figure 4B:
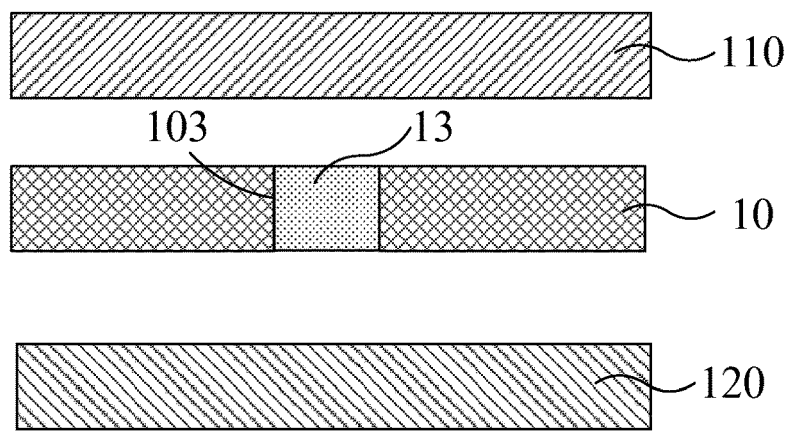
Figure 4C:
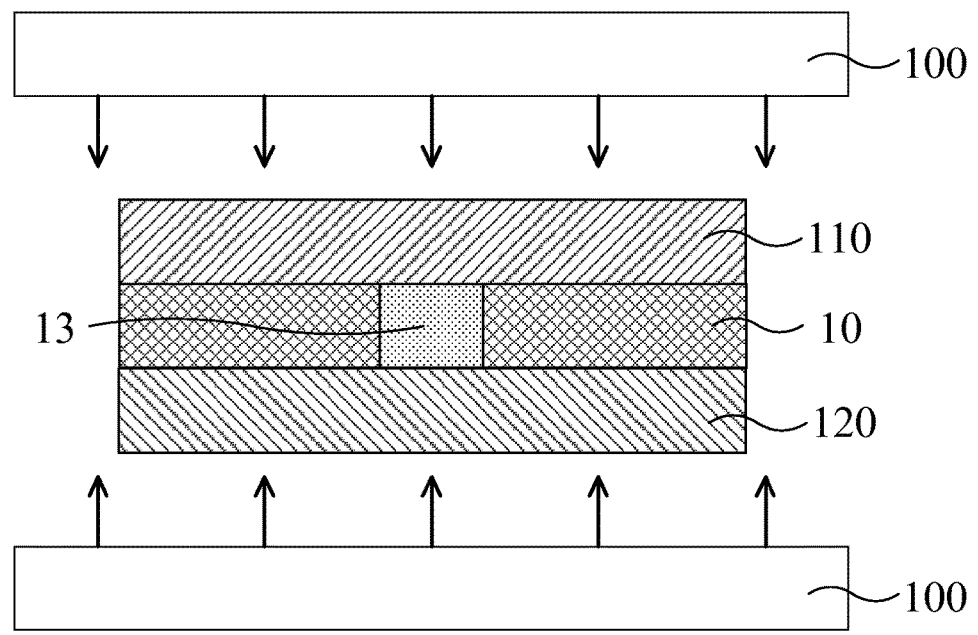

The insulating layer 10 is aligned with and disposed between the first conductive layer 110 and the second conductive layer 120, which have not yet patterned, and the electric contact material 13 is aligned with the conductive hole 13 of the insulating layer 10. The electric contact material 13 can be inserted into the conductive hole 13 first with a proper installation tool, as shown in FIG. 4B, thereby forming a conductive plug in the insulating layer. Alternatively, the electric contact material 13 can be placed right above or below the opening of the conductive hole 103 and then pushed into the conductive hole 13 while the first conductive layer 110 and/or the second conductive layer 120 are being pressed and laminated to the insulating layer 10, for example with a tool 100 as shown in FIG. 4C. The conductive layers can be laminated to the insulating layer 10 at one time or separately. In a further example, if the electric contact material 13 is in a liquid or paste state, one of the conductive layers, e.g. the second conductive layer 120, is laminated to the insulating layer 10 first to seal one end of the conductive hole 103. Then the liquid electric contact material 13 is filled into the corresponding conductive hole 103 from the free opening, and optionally solidified. Afterwards, the other conductive layer, e.g. the first conductive layer 110, is laminated to the resulting structure. Solid electric contact material 13 may also be used in this two-step lamination.

Figure 4D:
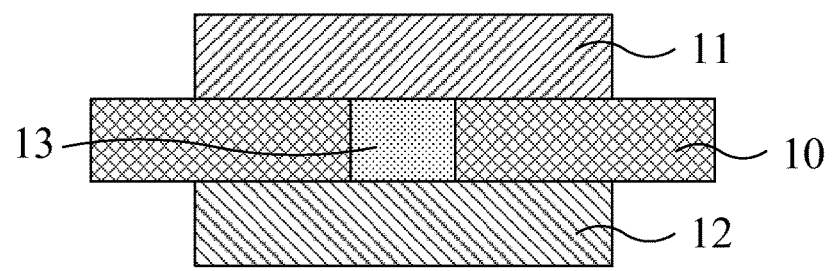

In the lamination process illustrated in FIG. 4C, the first conductive layer 110 and the second conductive layer 120 are respectively secured onto upper and lower surfaces of the insulating layer 10 with the electric contact material 13 therein. The first conductive layer 110 overlies a part of or the entire opening of the conductive hole 103 on the first surface 101 of the insulating layer 10, and the second conductive layer 120 overlies a part of or the entire opening of the conductive hole 103 on the second surface 102 of the insulating layer 10. Subsequently, a pattern-defining and etching process is performed to form the first and second conductive layers 110 and 120 into the first and second conductive structures 11 and 12 with specific configurations, respectively, as shown in FIG. 4D.

Figure 4E:
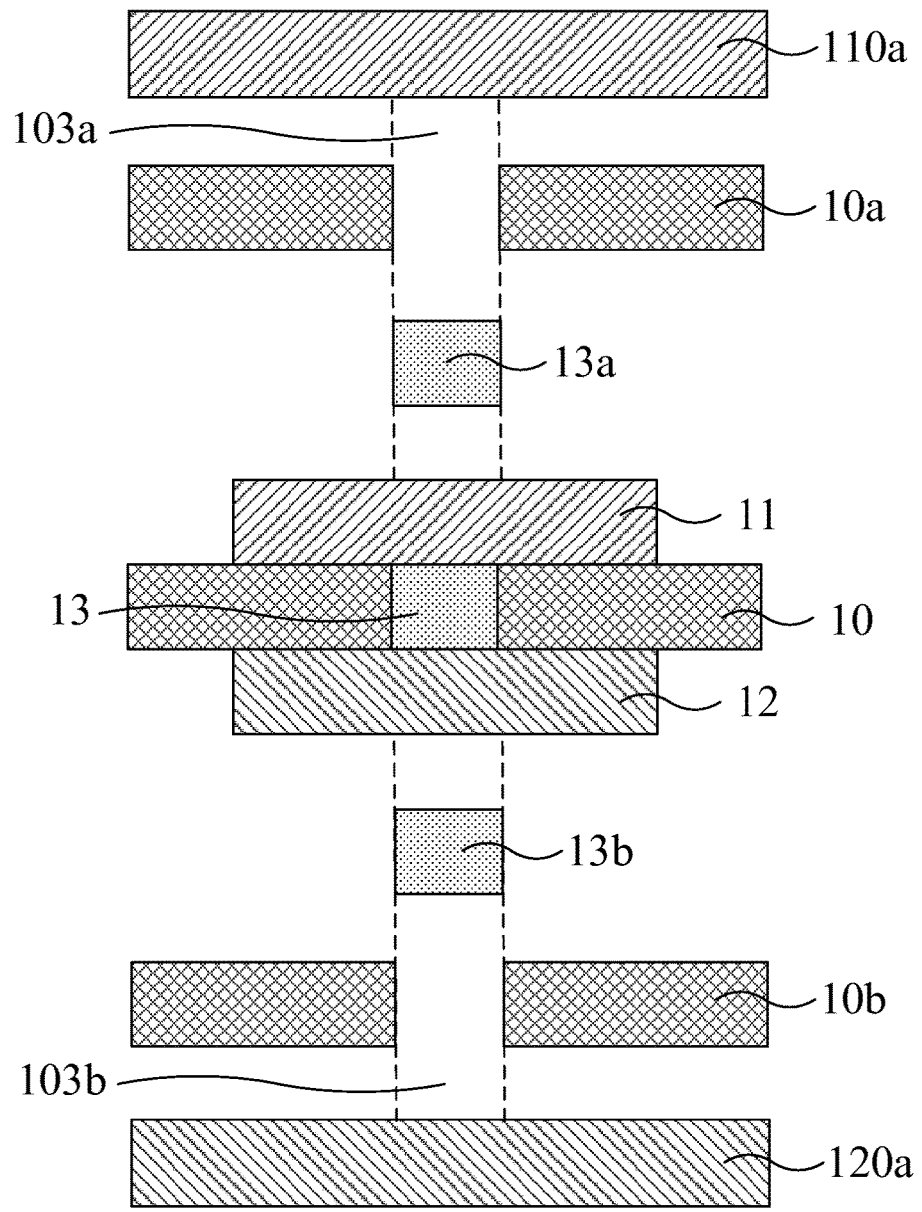
Figure 4F:
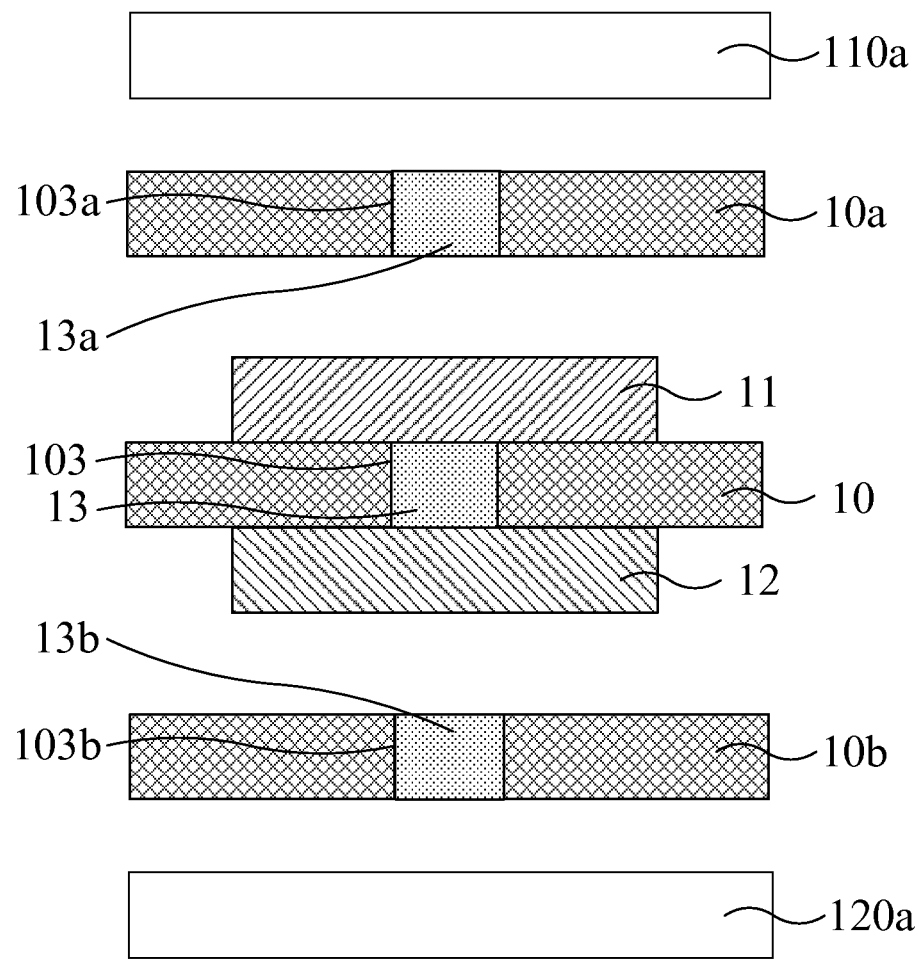
Figure 4G:
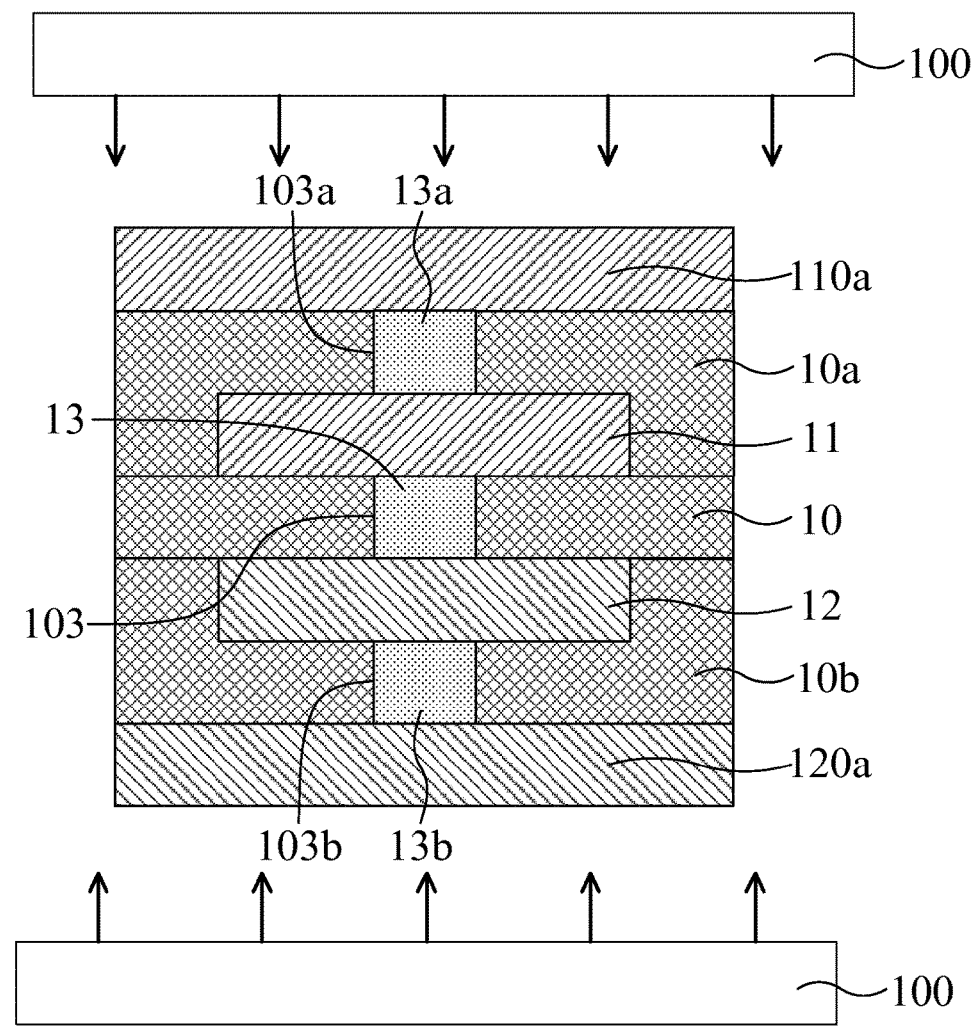
Figure 4H:
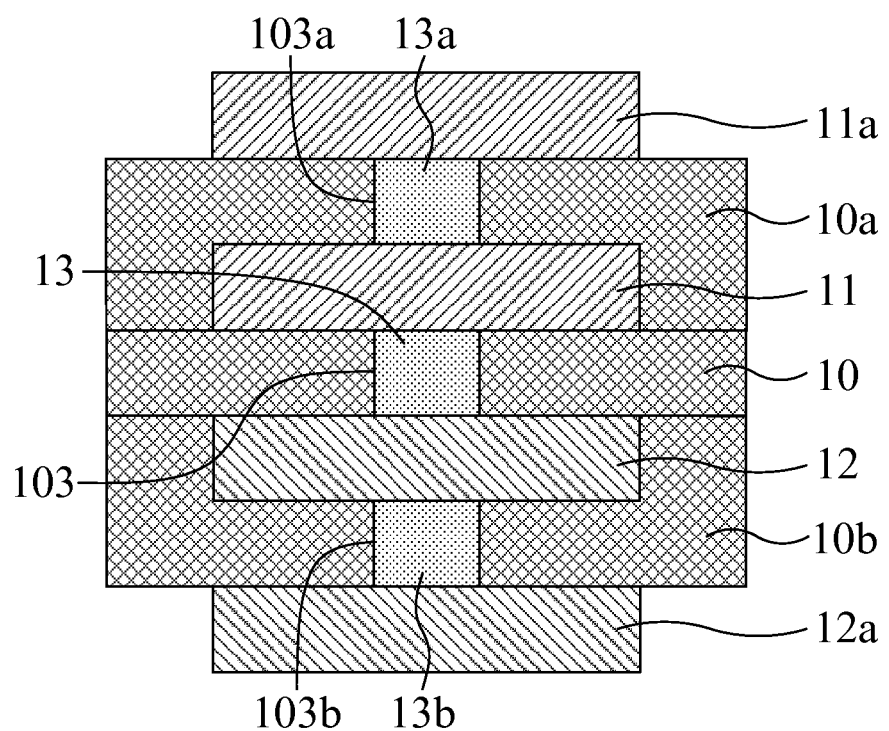

Then as shown in FIG. 4E, insulating layers 10a and 10b, electric contact materials 13a and 13b, third and fourth conductive layers 110a and 120a are provided, wherein one or more conductive holes 103a have been created in the insulating layer 10a, one or more conductive holes 103b have been created in the insulating layer 10b, and the third and fourth conductive layers 110a and 120a have not been patterned yet. As shown in FIG. 4F, the insulating layer 10a with the conductive hole or holes 103a therein and the electric contact material 13a to be inserted into the conductive hole or holes 103a are aligned between the first conductive structure 11 and the third conductive structure 11a. Likewise, the insulating layer 10b with the conductive hole or holes 103b therein and the electric contact material 13b to be inserted into the conductive hole or holes 103b are aligned between the second conductive structure 12 and the fourth conductive structure 12a. As a result, as shown in FIG. 4G, the insulating layers 10, 10a and 10b, the third conductive layer 110a, the fourth conductive layer 120a and the electric contact materials 13a and 13b are assembled with a tool in a manner that the first conductive structure 11 and the third conductive layer 110 are both in contact with the insulating layer 10a and the electric contact material 13a, and the second conductive structure 12 and the fourth conductive layer 120a are both in contact with the insulating layer 10b and the electric contact material 13b. In particular, the first conductive structure 11 and the third conductive layer 110 respectively overlie upper and lower openings of the conductive hole 103a, and the second conductive structure 12 and the fourth conductive layer 120a respectively overlie upper and lower openings of the conductive hole 103b. Afterwards, another pattern-defining and etching process is performed to form the third and fourth conductive layers 110a and 120a into the third and fourth conductive structures 11a and 12a with specific configurations, respectively, as shown in FIG. 4H. After applying protection layers 14a and 15a onto the upper and lower surfaces of the resulting structure, the PCB inter-layer structure 1a as shown in FIG. 3 is obtained.

Figure 5B:
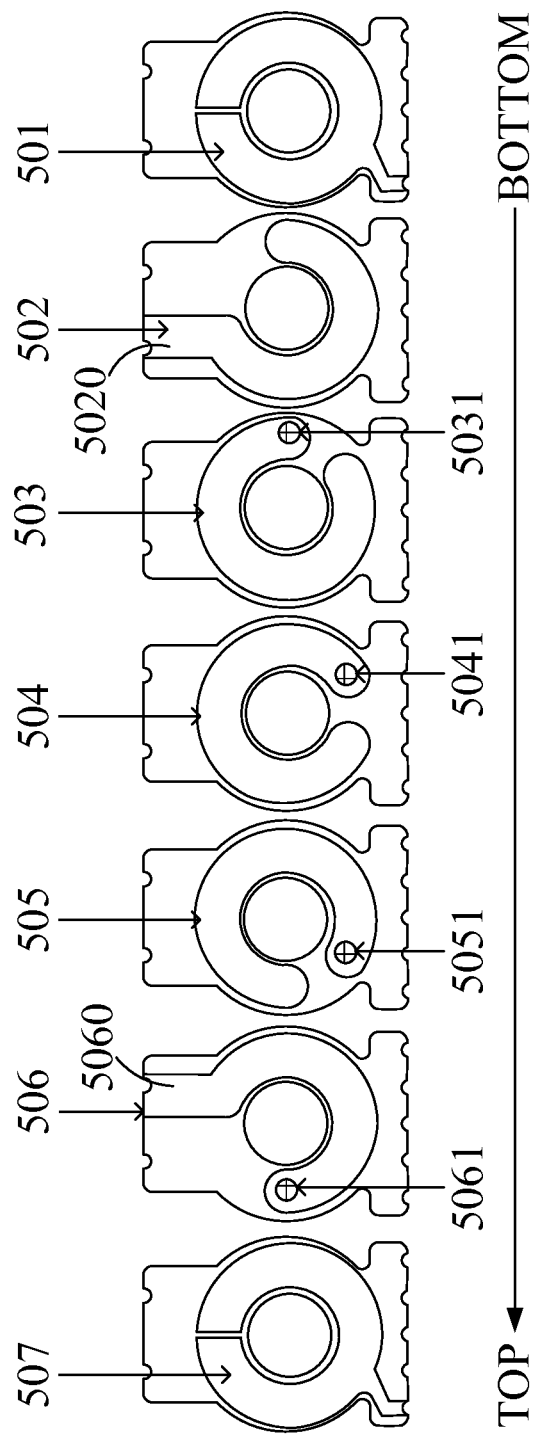
FIG. 5B is a scheme illustrating respective top views of a stack of layers included in the coil winding unit as shown in FIG. 5A.

The process as described above can be used to form the inter-layer conductive structure of a planar PCB coil winding unit, which may be a part of a planar type of electromagnetic component such as inductor, choke or adapter. Referring to FIGS. 5A and 5B, a perspective diagram schematically illustrating a coil winding unit of a planar type of PCB according to an embodiment of the present invention, and a scheme illustrating respective top views of a stack of layers included in the coil winding unit are shown. As shown, the coil winding unit includes a plurality of conductive structures 501~507 arranged as a stack of layers so as to be electrically equivalent to a coil assembly. The conductive structures 501 and 507 are the lowermost one and the uppermost one, respectively, and the other conductive structures 502~506 are sequentially disposed between the conductive structures 501 and 507. Alternatively, if there are two or more coil winding units serially combined, the conductive structure 501 or 507 can be commonly used between two coil winding units as the uppermost layer of the lower coil winding unit and the lowermost layer of the upper coil winding unit. The conductive structures 501 and 507 can function for electromagnetic shielding to prevent from the electromagnetic interference between each coil winding unit and the external as well as the electromagnetic interference between adjacent coil winding units.

Figure 6:
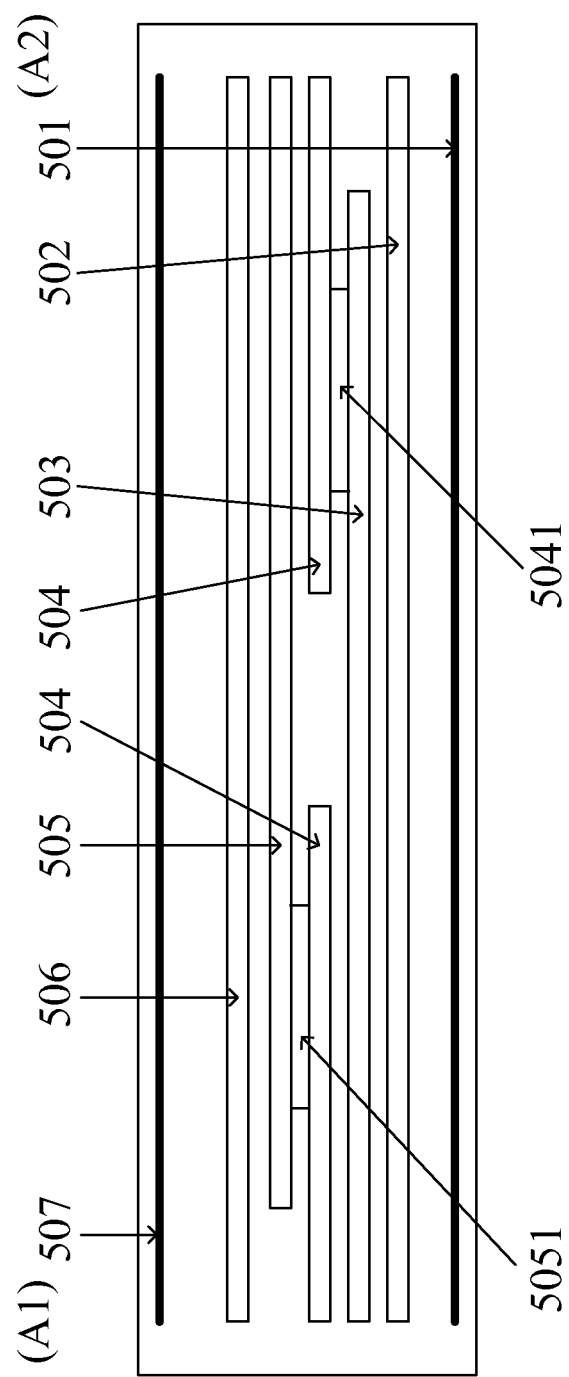
FIG. 6 is a cross-sectional view taken along the A1-A2 line of FIG. 5A.

As for the conductive structures 502~506, they function for electric conduction of the coil winding unit. In this example, each of the conductive structures 502~506 is a C-shaped ring with an opening, and when assembled, openings of the conductive structures 502~506 are staggered from one another. The upper conductive structure 502 and the lower conductive structure 506 have pad regions 5020 and 5060 extending outwards for electric connection to other elements. An insulating layer is disposed between every two adjacent conductive structures 502~506. Different insulating layers have conductive holes 5031~5061 arranged at different positions and filled with electric contact material, thereby forming conductive plugs. Every two adjacent conductive structures are electrically connected to each other through the electric contact material in the conductive hole(s) clamped therebetween. Through the electric contact material in the conductive holes 5031~5061, the conductive structures 502~506 are electrically interconnected to form the coil winding unit. The resulting electricity path is from the lower pad region 5020, through the C-shaped conductive structure 502, the electric contact material in the electric conductive hole 5031, the C-shaped conductive structure 503, the electric contact material in the electric conductive hole 5041, the C-shaped conductive structure 504, the electric contact material in the electric conductive hole 5051, the C-shaped conductive structure 505, the electric contact material in the electric conductive hole 5061 and the C-shaped conductive structure 506, to the upper pad region 5060. With reference to FIG. 5A and FIG. 6, it can be seen that the electricity path includes four counterclockwise cycles, wherein FIG. 6 is a cross-sectional view taken along A1-A2 line of FIG. 5A. The coil winding unit described above can be used in a planar type of electromagnetic component such as inductor, choke or adapter, and the planar type of electromagnetic component may include one or more coil winding units as described above.

Figure 7:
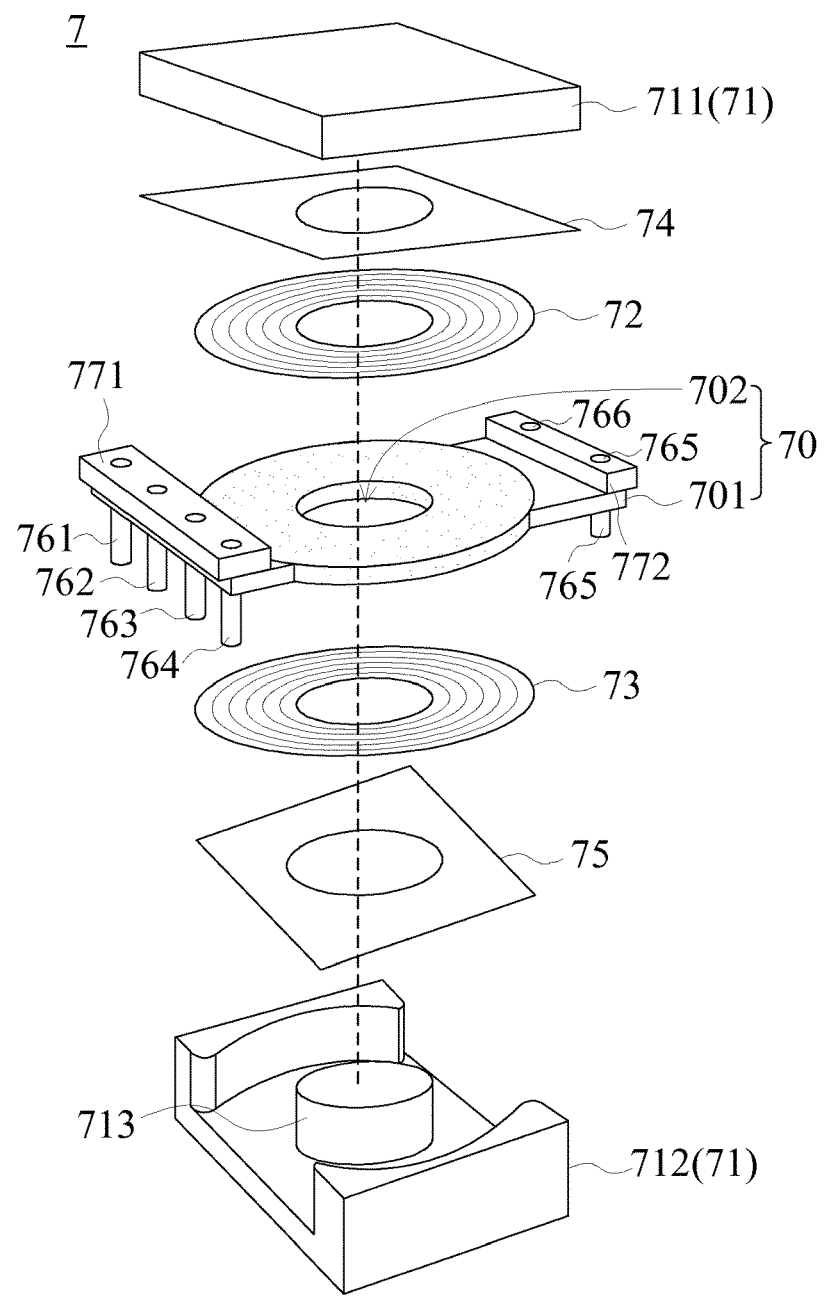
FIG. 7 is an exploded view schematically illustrating a planar type of electromagnetic component according to an embodiment of the present invention.

Please refer to FIG. 7, which is an exploded view schematically illustrating a planar type of electromagnetic component according to an example of the present invention. In this example, the planar type of electromagnetic component 7 includes a coil winding unit 70, a magnetic core 71, a first winding unit 72 and a second winding unit 73. The numbers of turns of the first winding unit 72 and second winding unit 73 may be the same or different. The coil winding unit 70 may have a structure as shown in FIGS. 5A, 5B and 6, and include at least one planar type of PCB inter-layered conductive structure. The planar type of PCB inter-layered conductive structure may be the one as illustrated in FIG. 1 or 3 and produced by the process as described with reference to FIGS. 2A~2D or 4A~4H. The magnetic core 71 is of a two-piece type, and for example, may be of an E-I or E-E type. The magnetic core 71 is sleeved around the coil winding unit 70 in a manner that the conductive path of the coil winding unit surrounds a specified portion of the magnetic core 71, e.g. the central post of the magnetic core 71. The planar type of electromagnetic component 7 may alternatively be any other suitable type of electromagnetic component, e.g. common mode choke or coupled inductor. While a general inductor includes a single winding, a common mode choke or coupled inductor includes two windings having the same number of turns.

Hereinafter, the structure of the planar type of electromagnetic component 7 will be described in more detail.

As shown in FIG. 7, the coil winding unit 70 includes a main body 701 and a through hole 702 in the center of the main body 701. The magnetic core 71 includes a first magnetic core portion 711 and a second magnetic core portion 712, and for example, may be an I-type or E-type magnetic core. The second magnetic core portion 712 includes an axial member 713, which is a central post disposed between two side posts in this example. The second magnetic core portion 712 is engageable with the first magnetic core portion 711 with the axial member 713 penetrating through the through hole 702 of the coil winding unit 70 of the planar type of PCB so as to form at least one closed magnetic loops.

Further referring to FIG. 7, the first winding unit 72 and the second winding unit 73 included in the planar type of electromagnetic component 7 are crossover coils, and may be primary winding, secondary winding or auxiliary winding. Likewise, the coil winding unit 70 of the planar type of PCB may also be any of the primary winding, secondary winding and auxiliary winding. The first winding unit 72 being the crossover coil type is disposed between the main body 701 of the coil winding unit 70 of the planar type of PCB and the first magnetic core portion 711, while the second winding unit 73 being the crossover coil type is disposed between the main body 701 of the coil winding unit 70 of the planar type of PCB and the first magnetic core portion 712. In a specific but non-limiting example, the coil winding unit 70 of the planar type of PCB, the first winding unit 72 and the second winding unit 73 are primary winding, secondary winding and auxiliary winding, respectively. Alternatively, the secondary winding and auxiliary winding may also be in the form of coil winding unit similar to the coil winding unit 70 and produced by a method according to the present invention as described above.

Furthermore, the planar type of electromagnetic component 7 may include a first insulating film layer 74 and a second insulating film layer 75, wherein the first insulating film layer 74 is disposed between the first magnetic core portion 711 and the first winding unit 72, and the second insulating film layer 75 is disposed between the second winding unit 73 and the second magnetic core portion 712. The first winding unit 72, second winding unit 73, first insulating film layer 74 and second insulating film layer 75 have respective through holes aligned with the through hole 702 of the coil winding unit 70 of the planar type of PCB for the axial member 713 of the second magnetic core portion 712 to penetrate therethrough. In this embodiment, the electromagnetic component 7 further includes six columns of conductive pins 761~766 and two conductive bobbins 771 and 772. The conductive pins 761~766 penetrate through the main body 701 at opposite sides of the coil winding unit 70 of the planar type of PCB to be secured onto the conductive bobbins 771 and 772. Alternatively, the main body 701 has recesses on opposite sides thereof, as shown in FIG. 5A, each of which receives therein one of the conductive pins laterally. The disposition of the conductive pins in the recesses would enhance the mechanical strength of the conductive pins. The six conductive pins 761~766 are classified into three pairs of conductive pins, each pair being electrically coupled thereto one of the three coil winding units, i.e. the coil winding unit 70 serving as the primary winding, the first winding unit 72 serving as the secondary winding, and the second winding unit 73 serving as the auxiliary winding. In other words, two ends of the winding unit are respectively coupled to the two conductive pins of the corresponding pair. Through the conductive pins 761~766, the primary winding, secondary winding and auxiliary winding of the planar type of electromagnetic component 7 could be electrically connected to other electrical components. In an alternative embodiment, the planar type of electromagnetic component 7 does not include conductive bobbins, and each conductive pin is inserted into one of the conductive pin holes of the coil winding unit 70 at opposite sides (not shown). The conductive pin holes would enhance the mechanical strength of the conductive pins.

According to the present invention, a PCB inter-layer conductive structure can be produced by an environment-friendly method, which does not need any highly polluting electroplating process. The method for producing the PCB inter-layer conductive structure according to the present invention is further advantageous in simplifying the manufacturing process and reducing cost. Furthermore, the PCB inter-layer conductive structure is suitable to be applied to a large-current PCB. For example, it can be used for multi-layer conduction in a power circuitry or used in a coil winding unit of a planar type of PCB in a power component, e.g. an electromagnetic component such as planar adapter, inductor, choke, common mode choke or reactor. The configurations of the conductive structures included in the PCB inter-layer conductive structure vary with the routing design among the electronic elements of the electronic product where they are used.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for producing an inter-layer conductive structure of a circuit board, comprising steps of:
    a) providing a first insulating layer, which has at least a first hole therein;
    b) inserting a first electric contact material, which is formed, as a body with size and shape consistent to the first hole to minimize voids in the first hole, into the first hole of the first insulating layer to form a first conductive plug;
    c) laminating a first conductive layer onto a first surface of the first insulating layer;
    d) laminating a second conductive layer onto a second surface of the first insulating layer;
    e) performing a first pattern-defining and etching procedure for the first conductive layer to form a first conductive structure after the laminating step c);
    wherein after the laminating steps c) and d) are completed, the first conductive plug has two ends thereof in electric contact with the first conductive layer and the second conductive layer, respectively, and
    f) performing a second pattern-defining and etching procedure for the second conductive layer to form a second conductive structure after the laminating step d);
    wherein the performing steps e) and f) are performed simultaneously or separately, and after the performing steps e) and f), at least one of the first conductive structure and the second conductive structure partially covers the corresponding one of the two ends of the first conductive plug in contact therewith.

2. The process according to claim 1, wherein the inserting step b) is performed before the laminating steps c) and d).

3. The process according to claim 1, wherein the inserting step b) is performed together with one of the laminating steps c) and d), and the other of the laminating steps c) and d) is performed subsequently.

4. The process according to claim 1, wherein one of the laminating steps c) and d) is performed before the inserting step b), and the other of the laminating steps c) and d) is performed together with the inserting step b).

5. The process according to claim 1, wherein one of the laminating steps c) and d) is performed before the inserting step b), and the other of the laminating steps c) and d) is performed after the inserting step b).

6. The process according to claim 1, providing step a), the first insulating layer and the first electric contact material are allocated between the first conductive layer and the second conductive layer with the first electric contact material being aligned with the first hole of the first insulating layer.

7. The process according to claim 1, further comprising steps of:
    providing a second insulating layer, a third conductive layer, and a second electric contact material, wherein the second insulating layer including at least a second hole therein;
    inserting the second electric contact material into the second hole of the second insulating layer to form a second conductive plug;
    laminating the third conductive layer onto a surface of the second insulating layer opposite to the first conductive structure; and
    performing a third pattern-defining and etching procedure for the third conductive layer laminated to the second insulating layer to form a third conductive structure.

8. The process according to claim 7, further comprising steps of:
    providing a third insulating layer, a fourth conductive layer, and a third electric contact material, wherein the third insulating layer including at least a third hole therein;
    inserting the third electric contact material into the third hole of the third insulating layer to form a third conductive plug;
    laminating the fourth conductive layer onto a surface of the third insulating layer opposite to the second conductive structure; and
    performing a fourth pattern-defining and etching procedure for the fourth conductive layer laminated to the third insulating layer to form a fourth conductive structure.

9. The process according to claim 8, wherein at least one of the first, second and third insulating layers is formed of a prepreg; at least one of the first, second, third and fourth conductive layers is formed of metal copper; and at least one of the first, second and third electric contact material is tin alloy.

10. The process according to claim 8, wherein at least one of the first, second, third and fourth conductive layers is laminated to the corresponding insulating layer by way of heat press with a temperature ranged between 100 and 250° C.

11. The process according to claim 1, wherein after the performing steps e) and f), the first conductive structure and the second conductive structure cover the entire area of the two ends of the first conductive plug, respectively.

12. The process according to claim 1, wherein at least one of the performing steps e) and f) includes a lithographic process.

13. The process according to claim 1, wherein the electric contact material differs from a material of the first conductive layer or a material of the second conductive layer.

14. A process for producing an inter-layer conductive structure of a circuit board, comprising steps of:
    a) providing a first insulating layer, which has at least a first conductive hole therein;
    b) inserting a first electric contact material, which is formed, by a non-electroplating process, as a body with size and shape consistent to the first conductive hole to minimize voids in the first conductive hole, into the first conductive hole of the first insulating layer to form a first conductive plug;

c) laminating a first conductive layer onto a first surface of the first insulating layer by way of heat press with a temperature ranged between 100 and 250° C.;
d) laminating a second conductive layer onto a second surface of the first insulating layer by way of heat press with a temperature ranged between 100 and 250° C.;
e) performing a first pattern-defining and etching procedure for the first conductive layer to form a first conductive structure after the laminating step c);
wherein after the laminating steps c) and d) are completed, the first conductive plug has two ends thereof in electric contact with the first conductive layer and the second conductive layer, respectively, and
f) performing a second pattern-defining and etching procedure for the second conductive layer to form a second conductive structure after the laminating step d);
wherein the performing steps e) and f) are performed simultaneously or separately, and after the performing steps e) and f), at least one of the first conductive structure and the second conductive structure partially covers the corresponding one of the two ends of the first conductive plug in contact therewith.

* * * * *